United States Patent
Osawa (10) Patent No.: US 9,753,564 B2
(45) Date of Patent: Sep. 5, 2017

(54) TOUCH SENSOR (71) Applicant: POLYMATECH JAPAN CO., LTD., Saitama (JP)

(72) Inventor: Yuta Osawa, Saitama (JP)

(73) Assignee: POLYMATECH JAPAN CO., LTD., Saitama (JP)

( * ) Notice: Subject to any disclaimer, the term of this patent is extended or adjusted under 35 U.S.C. 154(b) by 35 days.

(21) Appl. No.: 14/893,118

(22) PCT Filed: Jul. 11, 2013

(86) PCT No.: PCT/JP2013/068942
§ 371 (c)(1),
(2) Date: Nov. 23, 2015

(87) PCT Pub. No.: WO2015/004764
PCT Pub. Date: Jan. 15, 2015

(65) Prior Publication Data
US 2016/0117005 A1    Apr. 28, 2016

(51) Int. Cl.
*G06F 3/041* (2006.01)
*H03K 17/96* (2006.01)

(52) U.S. Cl.
CPC ......... *G06F 3/041* (2013.01); *H03K 17/9622* (2013.01); *G06F 2203/04103* (2013.01); *H03K 2217/960755* (2013.01)

(58) Field of Classification Search
None
See application file for complete search history.

(56) References Cited

U.S. PATENT DOCUMENTS

| | | | |
|---|---|---|---|
| 2009/0315859 A1* | 12/2009 | Chien | G06F 3/044 345/175 |
| 2010/0007621 A1* | 1/2010 | Kang | G06F 3/044 345/173 |
| 2010/0110712 A1 | 5/2010 | Ando et al. | |
| 2010/0302204 A1 | 12/2010 | Miyayama et al. | |

(Continued)

FOREIGN PATENT DOCUMENTS

| | | |
|---|---|---|
| JP | 2010-105588 A | 5/2010 |
| JP | 2010-277392 A | 12/2010 |
| JP | 2012-032923 A | 2/2012 |

(Continued)

OTHER PUBLICATIONS

International Search Report for PCT Patent App. No. PCT/JP2013/068942 (dated Aug. 13, 2013) with English language translation thereof.

*Primary Examiner* — Joseph Haley
(74) *Attorney, Agent, or Firm* — Cermak Nakajima & McGowan LLP; Tomoko Nakajima (57) ABSTRACT

A touch sensor includes sensor electrodes formed on a transparent substrate by patterning an electroconductive polymer, and a see-through preventing layer in the vicinity of the outsides of the sensor electrodes on a surface different from the surface of the transparent substrate on which the sensor electrodes are disposed. The see-through preventing layer may be made of the same material as the sensor electrodes, and can not only reduce the visibility of the space between the sensor electrodes, but also reduce short-circuiting between the sensor electrodes.

9 Claims, 6 Drawing Sheets (56) References Cited

U.S. PATENT DOCUMENTS

2012/0218028 A1* 8/2012 Chu .................. G06F 3/044
327/517
2014/0111711 A1 4/2014 Iwami et al.

FOREIGN PATENT DOCUMENTS

| JP | 2012-174578 A | 9/2012 |
| JP | 2013-054619 A | 3/2013 |

* cited by examiner

TOUCH SENSOR

This application is a national phase entry under 35 U.S.C. §371 of PCT Patent Application No. PCT/JP2013/068942, filed on Jul. 11, 2013, which is incorporated by reference.

TECHNICAL FIELD

The present invention relates to a touch sensor use in input devices of various types of electronic apparatuses.

BACKGROUND ART

A known touch sensor may have a structure including sensor electrodes formed on a transparent resin or glass substrate by patterning an ITO (indium tin oxide) layer, or may have a structure including sensor electrodes formed on a transparent substrate, as above, by patterning an electroconductive polymer. The former structure is highly transparent, but undesirably tends to increase cost. The latter structure is, on the other hand, advantageous for forming the electrode pattern more inexpensively than the case of the ITO layer because the latter structure allows the electrode pattern to be printed. Unfortunately, printing the electrode pattern does not allow a finer electrode pattern to be formed as desired without limitation. In addition, since electroconductive polymers are less transparent than ITO, the electrode pattern of an electroconductive polymer has a contrast to the outside thereof. This is a cause of what is called "see-through ribs", a phenomenon where the boundary of the electrode pattern can be seen.

For example, Japanese Unexamined Patent Application Publication No. 2010-105588 discloses a measure against such a see-through phenomenon for using an electroconductive polymer. In this disclosure, an insulating coating film having substantially the same color and substantially the same transmittance as an electroconductive coating film of a sensor electrode is formed around the electroconductive coating film, thereby reducing the visibility of the electrode pattern.

Japanese Unexamined Patent Application Publication No. 2012-32923 discloses the technique of forming dummy electrodes in the spaces between patterned electrodes. Since the dummy electrodes are formed on the same surface as the sensor electrodes, this technique enables the dummy electrodes and the sensor electrodes to be formed at one time and is thus efficient.

SUMMARY OF INVENTION

Technical Problem

For forming an electroconductive coating film or an insulating coating film on a transparent substrate, printing is generally performed. In this operation, the printing ink containing an electroconductive polymer has a very low solid content. Accordingly, the printing ink is likely to form an electroconductive coating film with a thickness as very small as less than 1 µm. On the other hand, the solid content in the printing ink containing an insulating material tends to be high, and accordingly, the insulating coating film is likely to have a thickness in the range of about 2 µm to 20 µm. The technique disclosed in 2010-105588 therefore causes a step to be formed at the boundary between the electroconductive coating film and the insulating coating film. The step undesirably reflects or refracts light, thereby helping the visibility of the electrode pattern increase. Although the insulating coating film and the electroconductive coating film may be formed to substantially the same thickness, it is difficult for printing to control thicknesses of the order of a micrometer or lower. If a coating film of less than 1 µm is intended to be formed, the resulting coating film is likely to have uneven thicknesses and result in poor appearance with color shading and uneven transmittances.

In the technique disclosed in Japanese Unexamined Patent Application Publication No. 2012-32923, dummy electrodes are formed. The dummy electrodes will be grounded and are accordingly required to be insulated from the sensor electrodes. Hence, the dummy electrodes and the sensor electrodes must be formed with gaps of some width therebetween.

This technique can be used for only a case of low-level requirements even though it is used to prevent the see-through phenomenon.

Accordingly, it is an object of the present invention to provide a technique for reducing the visibility of the electrode pattern of a touch sensor using an electroconductive polymer.

Solution to Problem

In order to achieve the above object, there is provided a touch sensor including sensor electrodes formed on a transparent substrate by patterning an electroconductive polymer, and a see-through preventing layer in the vicinity of the outsides of the sensor electrodes on a surface different from the surface of the transparent substrate on which the sensor electrodes are disposed.

In the touch sensor including the sensor electrodes formed on the transparent substrate by patterning an electroconductive polymer, the see-through preventing layer is formed on a surface different from the surface of the transparent substrate different on which the sensor electrodes are disposed. Therefore the sensor electrodes are not short-circuited even if the see-through preventing layer is electrically conductive.

Also, the see-through preventing layer is disposed in the vicinity of the outsides of the sensor electrodes on the surface different from the surface provided with the sensor electrodes thereon, the contrast between the sensor electrodes and the area outside the sensor electrodes can be reduced, and consequently, the boundaries of the sensor electrodes become less visible.

Preferably, the gap between each sensor electrodes and the see-through preventing layer is 0.2 mm or less. Since the gap between the sensor electrode and the see-through preventing layer is 0.2 mm or less, the boundaries of the sensor electrodes can be less visible.

The contrast mentioned herein refers to the degree of how much the pale portion to which the electroconductive polymer has not been applied is distinguished at the boundaries between the sensor electrodes and the other portion when the sensor electrodes are viewed from a distance. As the portion to which the electroconductive polymer has not been applied is wider between the sensor electrodes, the contrast seems to be increased, and the pattern of the sensor electrodes becomes more visible, accordingly. In addition, when the sensor electrodes and the see-through preventing layer overlap, the portion looking dark due to the overlap is also distinguished. This causes the pattern of the sensor electrodes to become visible, and this phenomenon also has a contrast.

The see-through preventing layer may expand to the vicinities of the interiors of the sensor electrodes. Since the see-through preventing layer expands from the vicinity of the outsides of the sensor electrodes to the vicinities of the interiors thereof, the portions reaching the vicinities of the interiors do not allow gaps to be formed between the sensor electrodes and the see-through preventing layer, thus reducing the contrast at the boundaries between the sensor electrodes and the see-through preventing layer. Also, overlaps of the sensor electrodes with the see-through preventing layer are formed by expanding the see-through preventing layer to the inner sides of the sensor electrodes. The overlaps merely occupy very small areas of the vicinities of the interior of the sensor electrodes, and the increase in contrast resulting from the overlaps can be reduced. Consequently, the boundaries of the sensor electrodes can be less visible.

Preferably, each sensor electrode and the see-through preventing layer have an overlap of 0.2 mm or less. Since the overlap of the sensor electrodes with the the see-through preventing layer is set to 0.2 mm or less, the boundaries of the sensor electrodes can be less visible.

The see-through preventing layer may be made of an electroconductive polymer. Since the see-through preventing layer contains an electroconductive polymer, the see-through preventing layer can have the same hue as the sensor electrodes. In addition, since the printing ink containing an electroconductive polymer has a very low solid content and, accordingly, can form a very thin see-through preventing layer of 1 µm or less, the height of the steps formed at boundaries of the see-through preventing layer can be small, and accordingly, reflection of light from the steps can be reduced. Thus, the boundaries of the sensor electrodes are muted, and accordingly the visibility of the sensor electrodes can be reduced.

The see-through preventing layer may be made of the same material as the sensor electrodes. Since the see-through preventing layer is made of the same material as the sensor electrodes, the hue and tone of the see-through preventing layer are approximated to those of the sensor electrodes. Consequently, the visibility of the boundaries of the sensor electrodes is reduced.

The see-through preventing layer may be disposed in the space between each adjacent pair of the sensor electrodes. Since the see-through preventing layer is disposed in the space between each adjacent pair of the sensor electrodes, the see-through preventing layer alleviates an extreme reduction of the tone of the spaces with respect to the tone of the sensor electrodes, thus reducing the visibility of the space between the sensor electrodes.

When the see-through preventing layer lies within the space between the sensor electrodes, the length of the see-through preventing layer in the width direction of the space may be more than 40% relative to the width of the space, that is, the distance between the sensor electrodes. When the width of the see-through preventing layer within the space exceeds 40% relative to the width of the space, the gap between each sensor electrode and the see-through preventing layer can be small. Consequently, the boundaries of the sensor electrodes can be less visible.

In the touch sensor, the see-through preventing layer may be disposed opposite the sensor electrodes with the transparent substrate therebetween. Since the see-through preventing layer is disposed opposite the sensor electrodes with the transparent substrate therebetween, the sensor electrodes are not short-circuited even if the see-through preventing layer is electrically conductive.

The touch sensor may further include a resist layer covering the sensor electrodes, and the see-through preventing layer may be disposed on the surface of the resist layer. Since the sensor electrodes are disposed separate from the see-through preventing layer with the resist layer therebetween, the sensor electrodes are not short-circuited even if the see-through preventing layer is electrically conductive.

Advantageous Effects of Invention

According to the touch sensor of the present invention, the visibility of the space between the sensor electrodes can be reduced. In addition, in the touch sensor in which the space between the sensor electrodes is less visible, a short circuit between the sensor electrodes becomes unlikely to occur.

DESCRIPTION OF EMBODIMENTS

The present invention will be further described with reference to the following embodiments. Common parts in the embodiments are designated by the same reference numerals, and thus description thereof is omitted. The descriptions of the same materials, operations, effects and so forth are also omitted.

Figure 1:
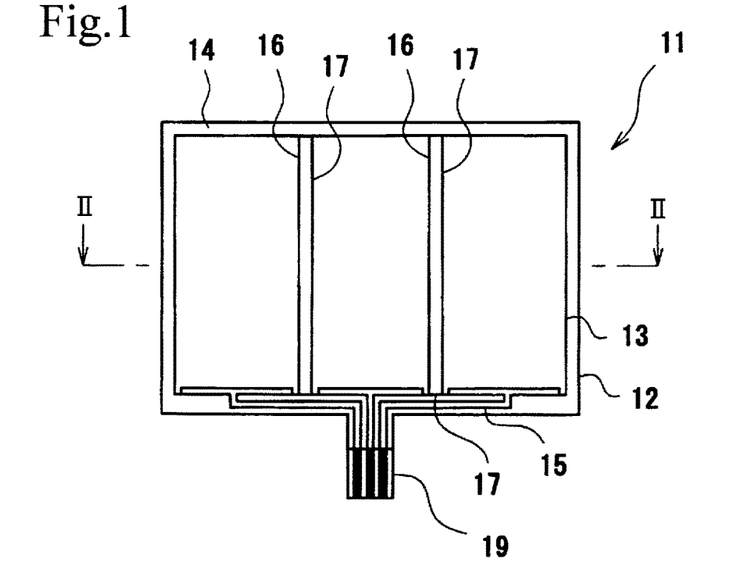
FIG. 1 is a plan view of a touch sensor according to a first embodiment.
Figure 2:
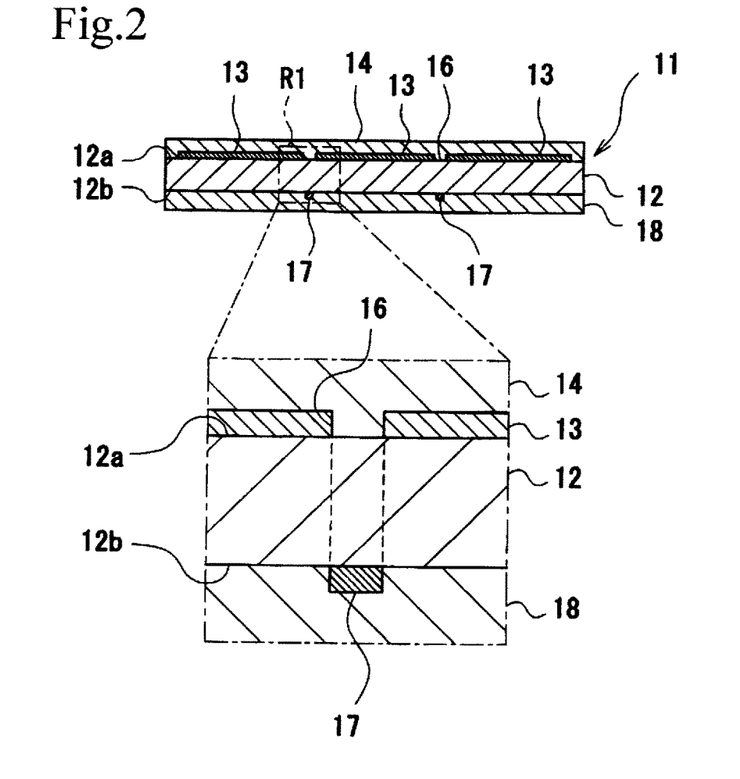
FIG. 2 is a sectional view taken along line II-II in FIG. 1, including a fragmentary enlarged sectional view of region R1 in the sectional view.

First Embodiment [FIGS. 1 and 2]

The touch sensor 11 of the present embodiment includes three sensor electrodes 13 formed by patterning an electroconductive coating film and a resist layer 14, each on the upper surface 12a of a transparent substrate 12, as shown in FIGS. 1 and 2. Each of the sensor electrodes 13 is provided with a conducting wire 15 extending from one end thereof to an electrode terminal 19.

Each adjacent pair of the sensor electrodes 13, 13 have a space 16 therebetween. Thus, the sensor electrodes 13 are arranged so as to be electrically isolated from each other. It is known that as the space 16 becomes narrower, the degree of the see-through phenomenon decreases. On the other hand, a narrow space 16 increases the risk of short-circuiting between adjacent sensor electrodes 13, 13. This reduces yield in mass production. Accordingly, the width of the space 16 is set to a minimum with which a stable insulation can be ensured.

The lower surface 12b of the transparent substrate 12 is provided with see-through preventing layers 17 and a cover layer 18 thereon. Each see-through preventing layer 17 is disposed in the vicinity of the outsides of the sensor electrodes 13. In other words, in the present embodiment, the see-through preventing layer 17 is disposed with no gaps from the outsides of the sensor electrodes 13 in a region that coincides with the space 16 and do not overlap with the sensor electrodes 13 when viewed from above (see the enlarged view of region R2 in FIG. 2). Hence, the see-through preventing layer 17 is formed with the same width as the width of the space 16 between the sensor electrodes 13, 13.

The see-through preventing layer 17 is intended to make it difficult to see the presence of the sensor electrodes 13. The see-through preventing layer 17 preferably has about the same chromatic features as the sensor electrodes 13. Accordingly, it is preferable that the see-through preventing layer 17 be formed of a material similar to the material of the sensor electrodes 13. Hence, the see-through preventing layer 17 preferably contains an electroconductive polymer, more preferably the same electroconductive polymer, as the sensor electrodes 13. By forming the see-through preventing layer using a coating liquid containing the same electroconductive polymer, substantially the same hue and transmittance can be imparted. In addition, since the coating film can be easily formed to about the same thickness, the see-through preventing layer can have not only substantially the same hue and transmittance, but also such a very small thickness as to reduce the height of the step at the boundary of the coating film, and thus can reduce reflection or refraction at the step.

The thickness of the see-through preventing layer 17 is about the same as, preferably the same as, that of the sensor electrodes 13. This is because when the see-through preventing layer 17, which is intended to reduce the visibility of the boundaries of the sensor electrodes 13, has the same thickness as the sensor electrodes 13, the color and transmittance of the see-through preventing layer become still closer to those of the sensor electrodes.

The transparent substrate 12 is intended for the substrate of the touch sensor 11, and is made of a transparent resin film. The transparency of the transparent substrate 12 may be such an extent that the touch sensor 11 can function, and is at least such an extent that a display on the rear side of the touch sensor 11 can be viewed from the front side of the touch sensor 11 therethrough.

The resin film may be made of, for example, polyethylene terephthalate (PET) resin, polyethylene naphthalate (PEN) resin, polycarbonate (PC) resin, polymethyl methacrylate (PMMA) resin, polypropylene (PP) resin, polyurethane (PU) resin, polyamide (PA) resin, polyether sulfone (PES) resin, polyetheretherketone (PEEK) resin, triacetyl cellulose (TAC) resin, or cycloolefin polymer (COP).

The transparent substrate 12 may be surface-treated by forming thereon a primer layer for enhancing the adhesion to the electroconductive polymer, a surface protection layer, an overcoat layer for preventing static charge or the like, or any other layers.

The sensor electrodes 13 are defined by a layer containing an electroconductive polymer. The reason of using the electroconductive polymer is that it allows the preparation of a coating liquid used for printing. Also, it allows the sensor electrodes 13 to be formed at a lower cost than the case of using ITO or the like.

An electroconductive polymer capable of forming a transparent layer is used as the material of the electroconductive polymer for forming the sensor electrodes 13. Examples of such a transparent electroconductive polymer include poly (para-phenylene), polyacetylene, and PEDOT-PSS (poly-3, 4-ethylenedioxythiophene-polystyrene sulfonate).

The thickness of the sensor electrodes 13 is preferably 0.04 µm to 0.2 µm, and more preferably 0.06 µm to 0.12 µm. Sensor electrodes 13 having a thickness of less than 0.04 µm can have a high resistance, and sensor electrodes having a thickness of more than 0.2 µm exhibits a low transparency. The thickness of the sensor electrodes 13 can be determined by measuring a sample prepared by applying the sensor electrodes 13 to the transparent substrate 12 with an atomic force microscope (AFM).

The conducting wires 15 are intended to connect the transparent electrodes 13 to the electrode terminals 19 connected to an electrical circuit of an information processing apparatus (not shown) or the like outside the touch sensor 11.

The conducting wires 15 are preferably formed of an electroconductive paste or ink containing a highly conductive metal, such as copper, aluminum, silver, or an alloy containing these metals. Silver conducting wires are preferred because silver is particularly conductive among these metals and alloys and is less likely to oxidize than copper.

The electrode terminals 19 can be formed by covering the front ends of the conducting wires 15 with carbon ink.

The resist layer 14 is an insulating coating film for preventing short-circuiting between the sensor electrodes 13 and protecting the sensor electrodes 13 from ultraviolet light, scratching, and the like, and is required to be transparent. In addition, the resist layer is advantageous for preventing the conducting wires 15 made of silver paste or metal from being sulfurized.

A hard resin is suitable as the resin for forming the resist layer 14, and examples thereof include acrylic resin, urethane resin, epoxy resin, polyolefin resin, and other resins. One of the advantageous resist layers is a urethane resin layer or a polyurethane-polyurea resin layer formed by curing a composition of materials containing a polyisocyanate component and a polyol component. This is because such a layer facilitates the control of hardness and has a high strength.

The thickness of the resist layer 14 is typically 6 µm to 20 µm, and is preferably 12 µm to 16 µm. The reason of this is that an excessively large thickness can result in poor flexibility, and that an excessively small thickness can result in insufficient protection for the sensor electrodes 13.

The cover layer 18 is intended to protect the see-through preventing layer 17 or the surface of the transparent substrate 12, and it may be made of the same material as the resist layer 14, or may be made of a different material from the resist layer 14.

Further layers may be provided in addition to the above-described layers, if necessary. Such layers include a coloring layer for imparting color as a whole and a layer for varying the refractive index for light or polarizing light.

For manufacturing the touch sensor 11, onto one surface of a transparent substrate 12 are applied a coating liquid containing an electroconductive polymer that will form electrode sensors 13, a coating liquid of a silver paste or the like that will form conducting wires 15, and a coating liquid that will form a resist layer 14 in that order by printing or the like. Onto the other surface of the transparent substrate 12 are applied a coating liquid containing an electroconductive polymer that will form see-through preventing layers 17, a coating liquid of silver paste, if necessary, that will form optional conducting wires 15, and a coating liquid that will form a cover layer 18 in that order by printing or the like. Thus, the touch sensor 11 can be manufactured.

In the touch sensor 11, the sensor electrodes 13 and the see-through preventing layers 17 are disposed on different surfaces with the transparent substrate 12 therebetween. Consequently, the sensor electrodes 13, 13 do not have a risk of leakage therefrom even if the see-through preventing layers 17 contain an electroconductive polymer, thus being insulated with reliability. Also, since each see-through preventing layer 17 is disposed between the sensor electrodes 13, 13 when viewed from above, the touch sensor allow the sensor electrodes 13 to be less visible.

In addition, since the transparent substrate 12 is provided with the resist layer 14 on one surface thereof and the cover layer 18 on the other surface, the transparent substrate 12 is unlikely to warp.

Figure 3:
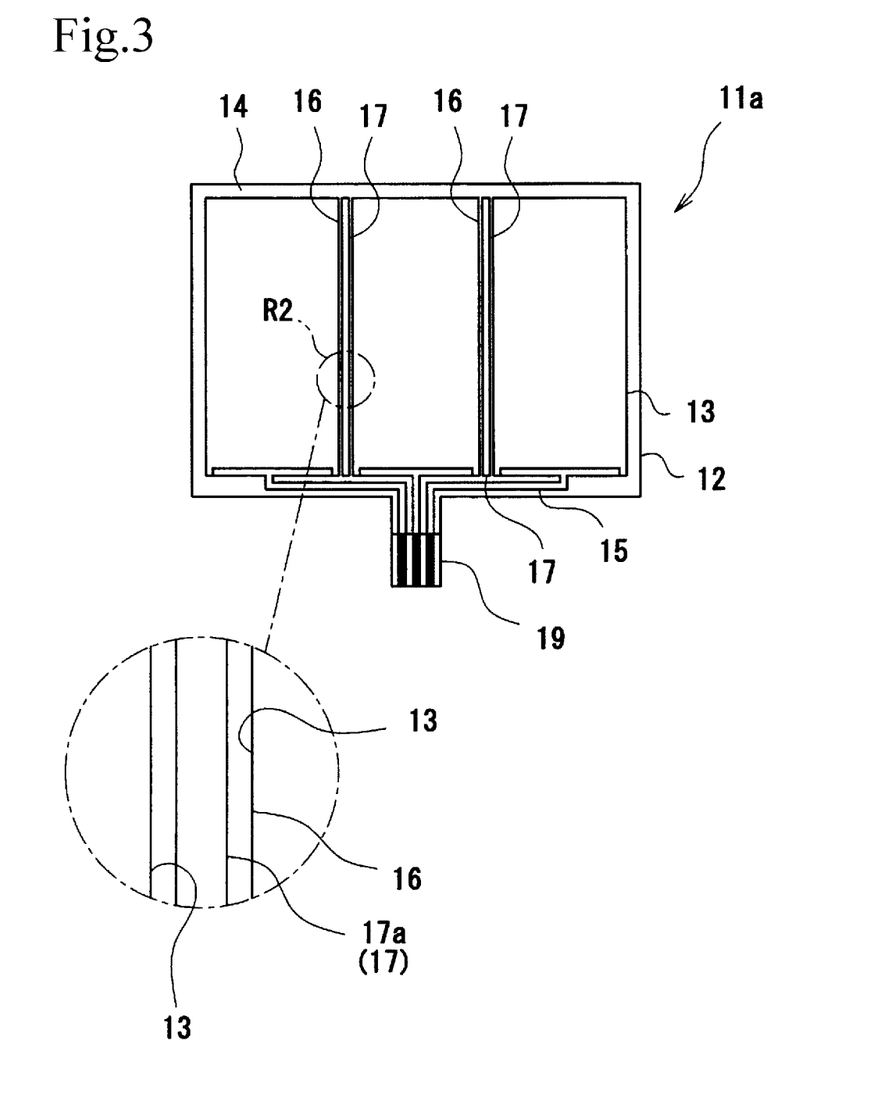
FIG. 3 is a plan view of a touch sensor according to a first modification, including a fragmentary enlarged view of region R2 in the plan view.
Figure 4:
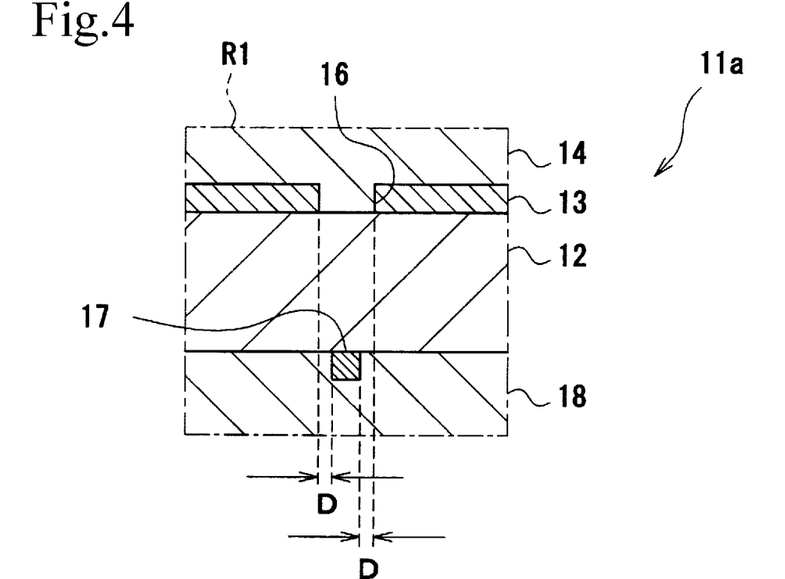
FIG. 4 is an enlarged view of the touch sensor shown in FIG. 3, similar to the fragmentary enlarged sectional view in FIG. 2.

First Modification of First Embodiment [FIGS. 3 and 4]

The see-through preventing layers 17 may be disposed at different positions from those of the touch sensor 11 shown in FIG. 1. FIGS. 3 and 4 show a touch sensor 11a according to a first modification. In this instance, each see-through preventing layer 17 is disposed in the vicinity of the outsides of the sensor electrodes 13 with gaps D from the outsides of the sensor electrodes 13. In terms of the see-through preventing layer 17, it is disposed adjacent to the sensor electrodes 13, 13 with gaps D therebetween at both sides of the see-through preventing layer.

The gap D is smaller than the width of the space 16. Accordingly, even if the gap D is formed between the sensor electrodes 13 and the see-through preventing layer 17, the visibility of the boundaries of the sensor electrodes 13 can be reduced. Preferably, the gap D is 200 μm or less.

Figure 5:
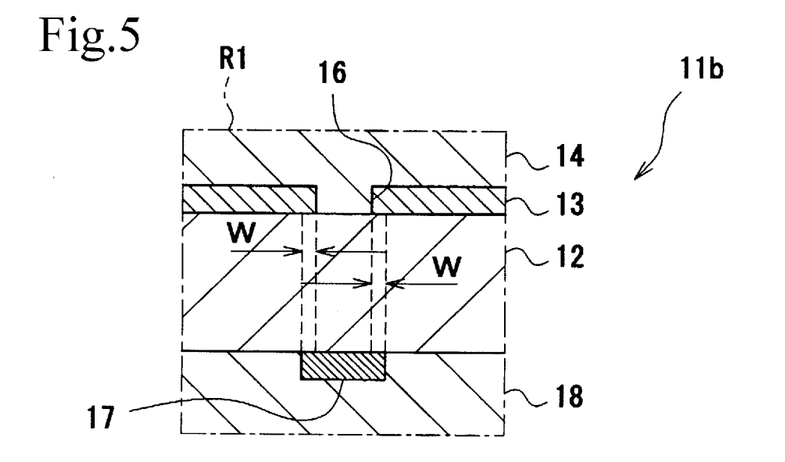
FIG. 5 is an enlarged view of a touch sensor according to a second modification, similar to the fragmentary enlarged sectional view in FIG. 2.

Second Modification of First Embodiment [FIG. 5]

FIG. 5 shows a touch sensor 11b according to a second modification as another modification in which the position of the see-through preventing layers 17 is varied. In this instance, each see-through preventing layer 17 expands to the inner regions of the boundaries of the sensor electrodes 13, that is, expands to the vicinities of the interiors of the sensor electrodes 13, from the vicinity of the outsides of the sensor electrodes 13. In other words, the see-through preventing layer 17 expands to regions where it overlaps with the sensor electrodes 13. Hence, the sensor electrodes 13 and the see-through preventing layer 17 have no gaps, but overlaps W therebetween.

The width of the overlap W is smaller than the width of the space 16. Accordingly, even if the overlaps W of the sensor electrodes 13 with the see-through preventing layer 17 are formed, the visibility of the boundaries of the sensor electrodes 13 can be reduced. Preferably, the width of the overlap W is 200 μm or less.

In comparison of the see-through preventing layers 17 between the touch sensor 11a having the gaps D of the first modification and the touch sensor 11b having the overlaps W, the touch sensor having the overlaps W is more highly effective in preventing the see-through phenomenon when the width of the overlaps W is equal to that of the gaps D. This is probably because the hues of the overlap W and the surroundings thereof are the same, while the contrast therebetween includes a difference in transmittance. On the other hand, the contrast between the see-through preventing layer 17 and sensor electrodes 13 and the gaps D includes differences in transmittance and hue. It is therefore assumed that the contrast between the overlap W and the surroundings thereof is not distinguished much. Allowing for printing misalignment, it is more effective, in reducing the visibility of the boundaries of the sensor electrodes 13, to form overlaps W at both sides of the see-through preventing layer 17, even if misalignment occurs in printing.

Figure 6:
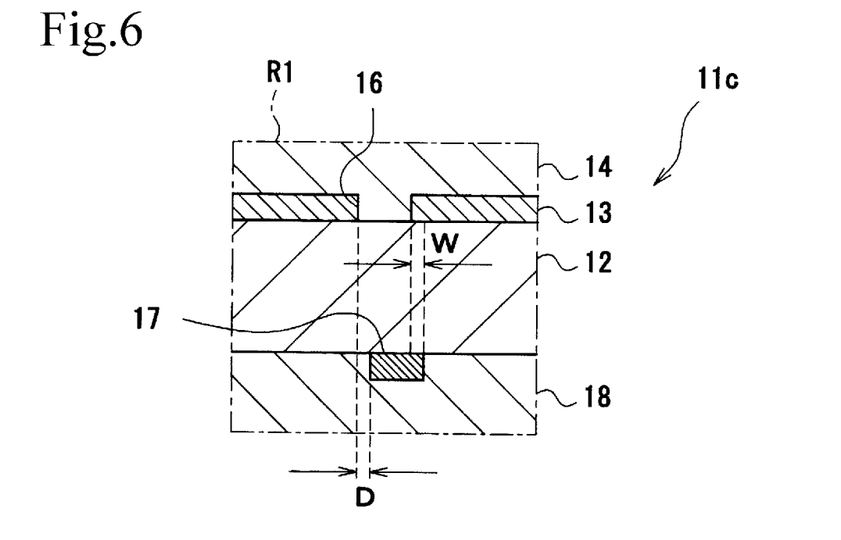
FIG. 6 is an enlarged view of a touch sensor according to a third modification, similar to the fragmentary enlarged sectional view in FIG. 2.

Third Modification of First Embodiment [FIG. 6]

FIG. 6 shows a touch sensor 11c according to a third modification as still another modification in which the position of the see-through preventing layers 17 is further varied. In this instance, one side of each see-through preventing layer 17 has a gap D from one of the sensor electrode 13, and the other side forms an overlap W with the other sensor electrode 13.

Even though the see-through preventing layer 17 has the gap D at one side thereof and forms the overlap W at the other side, the see-through preventing layer 17 present between the gap D and the overlap W reduces the contrast between the gap D and overlap W. Thus, the visibility of the boundaries of the sensor electrodes 13 can be reduced even in this form.

Figure 7:
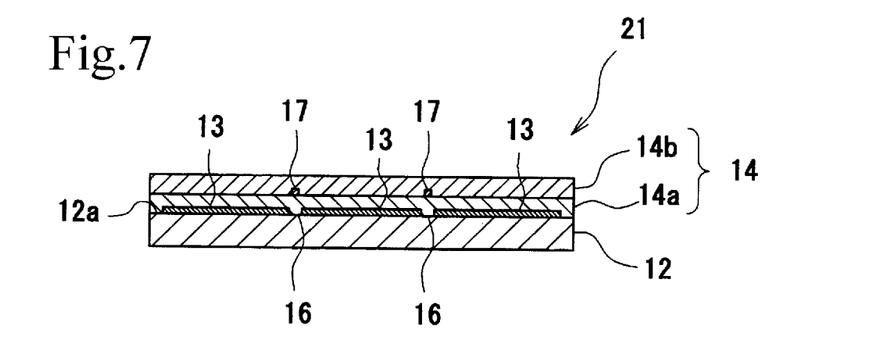
FIG. 7 is a sectional view of a touch sensor according to a second embodiment, similar to the sectional view in FIG. 2.

Second Embodiment [FIG. 7]

The touch sensor 21 of the present embodiment is different from touch sensor 11 in that it includes see-through preventing layers 17 and sensor electrodes 13 at the same side of a transparent substrate 12.

More specifically, in touch sensor 21, a first resist layer 14a, in addition to the sensor electrodes 13, is disposed on the upper surface 12a of the transparent substrate 12, as shown in FIG. 7. Then, the see-through preventing layers 17 and a second resist layer 14b are formed on the upper surface of the first resist layer 14a. The first resist layer 14a and the second resist layer 14b define a resist layer 14.

The first resist layer 14a and the second resist layer 14b may be made of the same material as the resist layer 14 used in touch sensor 11. Alternatively, resist layers for different purposes may be formed one on top of the other. For example, the first resist layer 14a may be intended as a sulfurization-resistant resist layer for preventing the conducting wires 15 from being sulfurized, and the second resist layer 14b may be intended as a light-resistant resist layer that does not easily transmit ultraviolet light.

For manufacturing touch sensor 21, each layer can be formed by printing in the same manner as the layers of touch sensor 11. For touch sensor 21, the upper surfaces 12a of the sensor electrodes 13 are covered with the first resist layer 4a, and then the see-through preventing layers 17 are formed on the first resist layer by printing.

Since the sensor electrodes 13 of touch sensor 21 are separated from the see-through preventing layers 17 by the first resist layer 14a, the sensor electrodes 13 are not electrically connected to each other through the see-through preventing layers 17.

Also, touch sensor 21 is easy to manufacture because printing operations are performed on one side. Furthermore, since a plurality of resist layers are formed, the total thickness of the resist layer 14 can be increased without forming pinholes therein, thus enhancing protection for the sensor electrodes 13. Resist layers for different purposes may be formed one on top of another.

Figure 8:
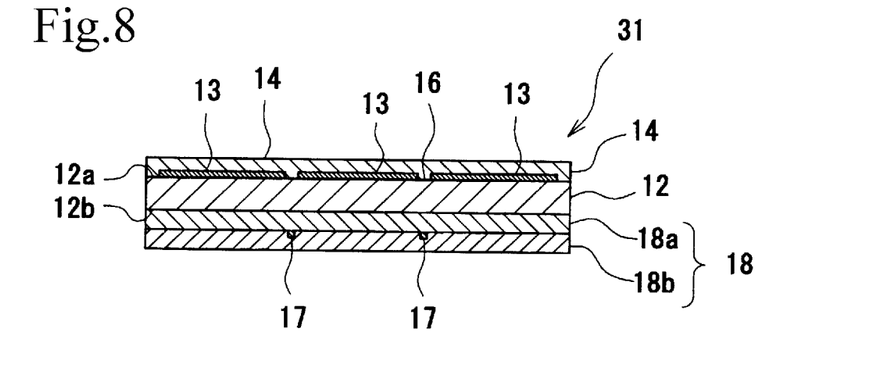
FIG. 8 is a sectional view of a touch sensor according to a third embodiment, similar to the sectional view in FIG. 2.

Third Embodiment [FIG. 8]

The touch sensor 31 of the present embodiment is the same as the touch sensor 11 of the first embodiment in that the sensor electrodes 13 and the see-through preventing layers 17 are provided on opposite surfaces with the transparent substrate 12 therebetween. The touch sensor 31 of the present embodiment is however different from touch sensor 11 in that the see-through preventing layers 17 are formed on a first cover layer 18a formed on the rear surface 12b side of the transparent substrate 12, as shown in FIG. 8.

In addition, a second cover layer 18b is further formed on the surface of the first cover layer 18a. The first cover layer 18a and the second cover layer 14b define a cover layer 18.

For forming the first cover layer 18a and the second cover layer 18b, layers of the same material may be formed one on top of the other, or layers for different purposes may be formed one on top of the other, as in the case of the resist layers 14a and 14b used in touch sensor 21. The cover layers 18a and 18b may be formed using the same coating liquid as the resist layers 14a and 14b.

Such a multilayer cover layer 18 can have a desired thickness without pinholes formed therein. If the conducting wires 15 are formed at the same side of the transparent substrate 12 as the see-through preventing layers 17, the multilayer cover layer 18 can reliably protect the conducting wires 15 and is thus advantageous.

Figure 9:
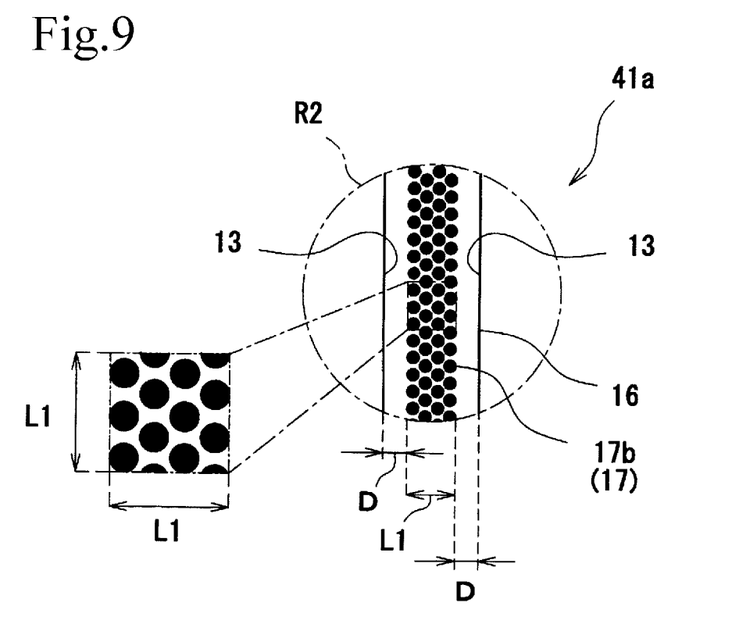
FIG. 9 is an enlarged view of a touch sensor according to a fourth embodiment, similar to the fragmentary enlarged sectional view in FIG. 3.
Figure 10:
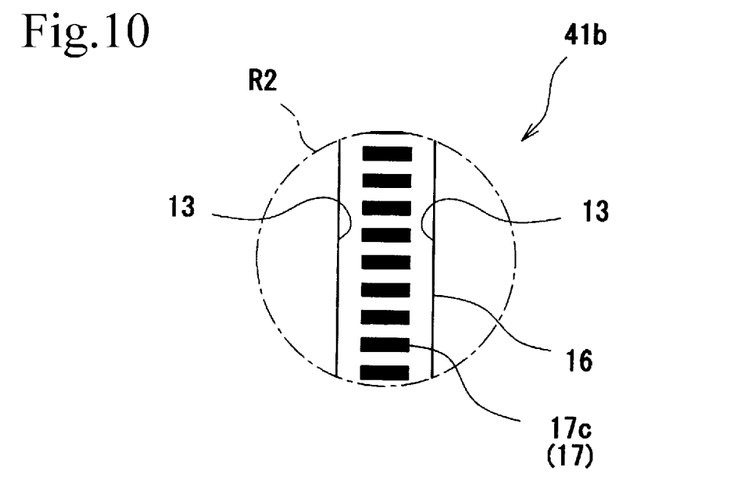
FIG. 10 is an enlarged view of a touch sensor according to a modification of the fourth embodiment, similar to the fragmentary enlarged sectional view in FIG. 3.

Fourth Embodiment [FIGS. 9 and 10]

Touch sensors 41a and 41b according to the present embodiment each include see-through preventing layers 17 modified in shape.

The see-through preventing layers 17 of touch sensor 11 are each defined by a continuous line 17a extending along the space 16 between the sensor electrodes 13, 13. On the other hand, the see-through preventing layer 17 of the touch sensor 41a shown in FIG. 9 is defined by dots 17b. In the form shown in FIG. 9, gaps D are formed between the see-through preventing layer 17 and the sensor electrodes 13.

If the see-through preventing layer 17 is not defined by a continuous shape as in the case of the see-through preventing layer 17 defined by dots 17b, the occupancy of the dots can be represented by the area percentage of the dots occupying a unit area defined by the width L1 of the see-through preventing layer 17 and the same length L1 as the width L1, as shown in FIG. 9. The occupancy of the dots is preferably 40% or more. When it is less than 40%, the area of empty spaces is increased excessively. As long as the occupancy of the dots is 40% or more, the dot can be formed with any dimensions and in any shape. The touch sensor 41b shown in FIG. 10 includes see-through preventing layers 17 each defined by stripes 17c as a modification of dots.

EXPERIMENTAL EXAMPLE 1

Touch sensors (Samples 1A to 4I), each including three sensor electrodes in plan view and having a cross section described below were prepared, and it was examined how much the see-through phenomenon could be prevented.

(Samples 1)

Multilayer films used as samples 1 (samples 1A to 1E) having the same sectional structure as the touch sensor described in the first embodiment were prepared by forming sensor electrodes on one surface and see-through preventing layers on another surface with a transparent substrate therebetween, and further printing a resist layer, a cover layer and conducting wires.

More specifically, a 100 μm thick transparent PET film was used as the transparent substrate. The sensor electrodes were formed of a transparent electroconductive ink (Clevios SV3 manufactured by Heraeus). The resist layer was formed of a transparent polyurethane resin ink. The see-through preventing layers were formed of the same coating liquid as the sensor electrodes. The cover layer was formed of the same coating liquid as the resist layer. The conducting wires were formed of a silver ink. Each of these layers was formed by screen printing. Electrode terminals were formed by coating the front ends of the conducting wires with a carbon ink by printing.

The thus formed multilayer films each included 0.10 μm thick sensor electrodes and see-through preventing layers, and a 16 μm thick resist layer and cover layer. The sensor electrode portion had a light transmittance of 85% for light having a wavelength of 550 nm, and the space between each pair of the sensor electrodes was 0.5 mm or 0.8 mm.

Samples 1 include Samples 1A to 1L in which the position and the width of the see-through preventing layers and the width of the sensor electrodes were varied. In Samples 1A to 1I of Samples 1, the space between the sensor electrodes was 0.5 mm. Sample 1A was a sample in which each see-through preventing layer was formed in the space (16) between the sensor electrodes with gaps (D) of 0 mm. Samples 1B to 1D were samples in which each see-through preventing layer had overlaps (W) of 0.3 mm, 0.2 mm, and 0.1 mm, respectively, with the sensor electrodes at both sides of the see-through preventing layer. Samples 1E to 1G were samples in which each see-through preventing layer was formed with a gap (D) of 0.2 mm, 0.15 mm and 0.1 mm, respectively, from the sensor electrodes. Sample 1H was a sample in which a see-through preventing layer was formed over the entire rear surface of the transparent substrate. Sample 1I was not provided with the see-through preventing layer.

Samples 1J to 1L were samples in which the sensor electrodes had a space of 0.8 mm therebetween and a gap (D) of 0.3 mm, 0.2 mm and 0.1 mm, respectively, from the see-through preventing layer.

(Samples 2)

Multilayer films used as Samples 2 (Samples 2A to 2L) having the same sectional structure as the touch sensor described in the second embodiment were prepared by forming sensor electrodes and a first resist layer on one surface of a transparent substrate, and further forming see-through preventing layers and a second resist layer on the first resist layer.

Samples 2A to 2L of Samples 2 included see-through preventing layers whose width and position were varied corresponding to Samples 1A to 1L, respectively. The plan views and the materials used were the same as in Samples 1.

(Samples 3)

Multilayer films used as Samples 3 (Samples 3A to 3L) having the same sectional structure as the touch sensor described in the third embodiment were prepared by forming sensor electrodes and a first resist layer on one surface of a transparent substrate, and forming a first cover layer on the other surface of the transparent substrate, and then see-through preventing layers and a second cover layer on the first cover layer.

Samples 3A to 3L of Samples 3 included see-through preventing layers whose width and position were varied corresponding to Samples 1A to 1L, respectively.

The plan views and the materials used were the same as in Samples 1.

(Samples 4)

Figure 11:
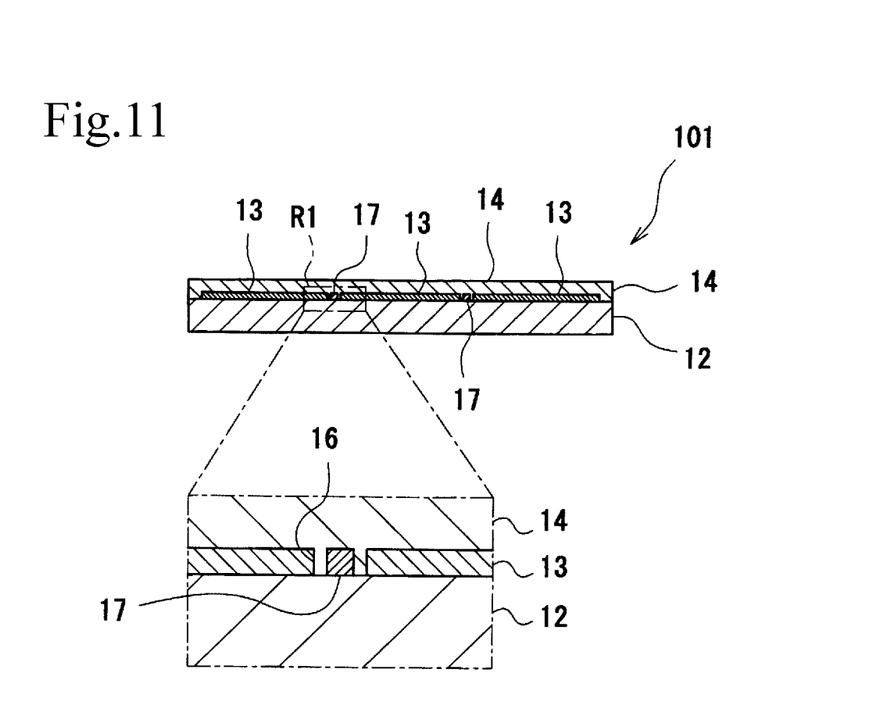
FIG. 11 is a sectional view of a touch sensor for comparison, similar to the sectional view in FIG. 2, including the fragmentary enlarged sectional view thereof.

Samples 4 (Samples 4A to 4L) of a touch sensor 101 had a known structure and were intended for comparison. More specifically, each layer of these samples were printed so as to have a sectional structure including sensor electrodes and see-through preventing layers on the same surface of a transparent substrate, and a resist layer thereon. The sectional structure of Sample 4G of these samples is shown in FIG. 11.

Samples 4A to 4L of Samples 4 included see-through preventing layers whose width and position were varied corresponding to Samples 1A to 1L, respectively, while the sensor electrodes and the see-through preventing layers were formed on the same surface. Accordingly, Samples 4A to 4L were prepared as below.

Sample 4A was a sample in which each see-through preventing layer was formed in the space between the sensor electrodes with no gaps so that the sensor electrodes and the see-through preventing layers define one layer. Samples 4B to 4D were samples formed by forming sensor electrodes so that each see-through preventing layer would have overlaps (W) of 0.3 mm, 0.2 mm, and 0.1 mm, respectively, with the sensor electrodes at both sides of the see-through preventing layer and then forming the see-through preventing layers. Samples 4E to 4G were samples in which sensor electrodes were formed so that the gap between each see-through preventing layer and the sensor electrodes would be 0.2 mm, 0.15 mm and 0.1 mm, respectively, and then the see-through preventing layers were formed. Sample 4G was a sample formed by forming sensor electrodes and then forming a see-through preventing layer over the entirety of the surface of the transparent substrate on which the sensor electrodes were disposed. Sample 4I was a sample not provided with the see-through preventing layers.

The plan views and the materials used were the same as in Samples 1.

Table 1 shows the effect of the thus prepared samples to prevent the see-through phenomenon. The effect of preventing the see-through phenomenon was rated any of 9 levels of "1" to "9" according to the gradually changing visibility of the boundaries of the sensor electrodes, from the case of very visible to the case of substantially invisible. The case where the boundaries of the sensor electrodes were substantially invisible was defined as "9", and the case where the boundaries of the sensor electrodes were hardly visible was defined as "8" or "7". The case where the sensor electrodes were not invisible but were becoming difficult to see was defined as any of "6" to "4". The case where the boundaries of the sensor electrodes were visible was defined as "3" or "2". The case where the boundaries of the sensor electrodes were very visible was defined as "1".

For example, in Table 1, the rating of Sample 1A, which is shown in the cell at the intersection of a column Sample 1 and a row Sample A, is "9".

Preferred ratings with which the sample can be used are "4" or higher of the ratings of "1" to "9". Mark "*" given to Samples 4A to 4H, 4K, and 4L, except for Samples 4I and 4J, represents that the sample cannot be used as a touch sensor because leakage occurred between adjacent sensor electrodes.

In Table 1, column 1 shows the "width (mm) of gaps or overlaps" of each sample, formed between each see-through preventing layer and the corresponding sensor electrodes" depending on the position and the width of the see-through preventing layers, and column 2 shows the "percentage (%) of the width of the see-through preventing layer relative to the width of the space".

TABLE 1

|  |  | Column 1 | Column 2 |  |  | First embodiment Sample 1 | Second embodiment Sample 2 | Third embodiment Sample 3 | Known art Sample 4 |
|---|---|---|---|---|---|---|---|---|---|
| Form of see-through preventing layer | No gaps, no overlaps | 0 mm | 100% | Space 0.5 mm | Sample A | 9 | 9 | 9 | 9* |
|  | Has Overlaps | 0.3 mm | 220% |  | Sample B | 3 | 3 | 3 | 3* |
|  |  | 0.2 mm | 180% |  | Sample C | 6 | 6 | 6 | 6* |
|  |  | 0.1 mm | 140% |  | Sample D | 8 | 8 | 8 | 8* |
|  | Has gaps | 0.2 mm | 20% |  | Sample E | 4 | 4 | 4 | 4* |
|  |  | 0.15 mm | 40% |  | Sample F | 5 | 5 | 5 | 5* |
|  |  | 0.1 mm | 60% |  | Sample G | 7 | 7 | 7 | 7* |
|  | Over entire surface |  |  |  | Sample H | 2 | 2 | 2 | 2* |
|  | No see-through preventing layer |  |  |  | Sample I | 1 | 1 | 1 | 1 |
|  | Has gaps | 0.3 mm | 25% | Space 0.8 mm | Sample J | 3 | 3 | 3 | 3 |
|  |  | 0.2 mm | 50% |  | Sample K | 5 | 5 | 5 | 5* |
|  |  | 0.1 mm | 75% |  | Sample L | 7 | 7 | 7 | 7* |

Samples A, or Samples 1A, 2A, 3A and 4A, which were not provided with gaps between the sensor electrodes and the see-through preventing layer, were rated "9" and evaluated as the best. On the other hand, Samples 1I, 2I, 3I and 4I, which were not provided with see-through preventing layers, exhibited high contrast between the sensor electrode portion and the other portions, clearly exhibiting the boundaries of the sensor electrodes. These samples were therefore rated "1". Samples H, or Samples 1H, 2H, 3H and 4H, in which a see-through preventing layer was formed over the entirety of a surface of the transparent substrate, exhibited high contrast between the sensor electrode portion and the other portions. However the contrast was lower than that of Samples I, and accordingly, rated "2".

Samples B to D, in which the see-through preventing layer expands to the vicinities of the interiors of the sensor electrodes so as to form overlaps, and Samples E to G, in which each see-through preventing layer was formed in the vicinity of the outsides of the sensor electrodes, exhibited the effect of preventing the see-through phenomenon.

Samples B to D will be considered. Samples B had overlaps of 0.3 mm, and the overlaps looked dark and were visible, accordingly making the boundaries of the sensor electrodes visible. On the other hand, Samples C had overlaps of 0.2 mm, and the overlaps were not distinguished much, accordingly making the boundaries of the sensor electrodes less visible. Samples D had overlaps of 0.1 mm, and the overlaps were not distinguished. Accordingly, the boundaries of the sensor electrodes were hardly visible. Samples E to G having gaps will be considered. Samples F had gaps of 0.15 mm, and the boundaries of the sensor electrodes thereof were less visible. Samples G had gaps of 0.1 mm, and the gaps looked pale and were not distinguished much, accordingly making the boundaries of the sensor electrodes hardly visible. The boundaries of the sensor electrodes of Samples E were less visible to the same extent as Samples F, but these samples were evaluated to be inferior to Samples F.

Samples J to L, in which the sensor electrodes had spaces of 0.8 mm therebetween, exhibited tendencies similar to Samples E to G. Each of Samples E had a gap of 0.2 mm, a see-through preventing layer of 0.1 mm and a gap of 0.2 mm in the space of 0.5 mm between each pair of the sensor electrodes. Each of Samples K having the same gaps of 0.2 mm as above had a gap of 0.2 mm, a see-through preventing layer of 0.4 mm and a gap of 0.2 mm in the space of 0.8 mm between each pair of the sensor electrodes. In comparison of these samples, the see-through preventing layers of Samples E were viewed together with the gaps at both sides thereof, thus looking wider than the actual width due to the width of the see-through preventing layers as small as 0.1 mm. This is probably the reason why Samples E were evaluated to be slightly inferior to Samples K. For this phenomenon, samples were compared in terms of the width of the see-through preventing layers relative to the width of the spaces. Samples E had a width of 20%, while Samples K had a width of 50%. In each of Samples F, the width accounted for 40%. Accordingly, it was found that when the width of the see-through preventing layer accounts for 40% or more of the width of the space between the sensor electrodes, the see-through preventing layer has a high effect of reducing the visibility of the boundaries of the sensor electrodes.

Accordingly, it was found that gaps of 0.2 mm or less is less visible, and that it is advantageous that the width of the see-through preventing layer accounts for 40% or more of the width of the space between the sensor electrodes.

In comparison of samples in which the width of the overlaps and the gaps were the same, samples having overlaps were evaluated to be superior. This is probably because the hues of the overlaps and the surroundings thereof are the same, while the contrast therebetween includes a difference in transmittance. On the other hand, the contrast between the see-through preventing layer and sensor electrodes and the gaps includes differences in transmittance and hue. Therefore the contrast between the overlaps W and the surroundings thereof is not distinguished much.

Accordingly, allowing for printing misalignment, it was found that it is more advantageous to select the position and width of the see-through preventing layer so as to form overlaps of 0.1 mm with the sensor electrodes at both sides of the see-through preventing layer. In this instance, gaps are not easily formed even if printing misalignment occurs.

EXPERIMENTAL EXAMPLE 2

For Experimental Example 2, Samples 1I to 17 were prepared in the same manner as in Experimental Example 1. The see-through preventing layers of these samples were defined by dots or stripes as shown in Table 2.

More specifically, the width of the spaces between the sensor electrodes were set to 0.5 mm, and the see-through preventing layers defined by dots or stripes were formed with gaps of 0 mm. The see-through preventing layer defined by dots was formed with a dot occupancy of 20%, 40%, or 60%, and the see-through preventing layer defined by stripes was formed with a stripe width/gap ratio of 0.1 mm/0.4 mm (occupancy: 20%), 0.2/0.3 mm (occupancy: 40%), 0.3 mm/0.2 mm (occupancy: 60%), or 0.4 mm/0.1 mm (occupancy: 80%).

Each sample was rated any of the 9 ratings according to the same criteria as in Experimental Example 1, and the results are shown in Table 2.

TABLE 2

|         | Sample No. | Occupancy (%) | Rating |
|---------|------------|---------------|--------|
| Dots    | 11         | 20            | 2      |
|         | 12         | 40            | 5      |
|         | 13         | 60            | 7      |
| Stripes | 14         | 20            | 2      |
|         | 15         | 40            | 4      |
|         | 16         | 60            | 6      |
|         | 17         | 80            | 8      |

The see-through preventing layer of Samples 1 and 4 having an occupancy of 20% were very thin and, accordingly, caused the contrast to look high and the boundaries of the sensor electrodes to be visible. On the other hand, see-through preventing layers having an occupancy of 40% or more exhibited the effect of reducing the contrast. In comparison between a dotted see-through preventing layer and a striped see-through preventing layer having the same occupancy, the dotted see-through preventing layer allowed the boundaries of the sensor electrode to be less visible.

The overlaps of the see-through preventing layer defined by dots or stripes with the sensor electrodes had lower contrast than those of the continuous solid see-through preventing layers of Experimental Example 1. Accordingly, if overlaps are formed, a dotted or striped see-through preventing layer is more effective in reducing the visibility of the overlaps and thus preferred.

The shapes, layer structures, materials, and so forth described in the above-described embodiments and experimental examples may be modified as required within the scope and purpose of the present invention. For example, known materials other than those described above may be used, and such modification is a part of the scope of the technical ideas of the present invention.

For example, the fourth embodiment in which the form of the see-through preventing layer is modified may be applied to the first to third embodiments, and the modifications of the first embodiment in which the position and width of the see-through preventing layer are varied may be applied to the second to fourth embodiments.

In addition, the sensor electrodes 13 and the conducting wires 15, for example, may be formed on part of one surface of the transparent substrate 12 or on the entire surface of the transparent substrate. Alternatively, these may be formed on both of the front and rear surfaces of the transparent substrate 12. For this structure, however, the first embodiment, in which the sensor electrodes 12 and the see-through preventing layers 17 are disposed with the transparent substrate 12 therebetween, cannot be applied. The shapes of the transparent electrodes 13, the metal conducting wires 14, and so forth are not limited to those shown in FIG. 1.

REFERENCE SIGNS LIST 11, 11a, 11b, 11c, 21, 31, 41a, 41b touch sensor
12 transparent substrate
12a upper surface (front surface)
12b lower surface (rear surface)
13 sensor electrode (electroconductive coating film)
14 resist layer
14a first resist layer
14b second resist layer
15 conducting wire
16 space
17 see-through preventing layer
17a continuous line 17b dots
17c stripes
18 cover layer
18a first coating layer
18b second coating layer
19 electrode terminal
R1, R2 region
D gap
W overlap
L1 length
41 known touch sensor

The invention claimed is:

1. A touch sensor comprising sensor electrodes formed on a transparent substrate by patterning an electroconductive polymer, and
 a plurality of see-through preventing layers in the vicinity of the outsides of the sensor electrodes on a surface different from the surface of the transparent substrate on which the sensor electrodes are disposed,
 wherein in a planar view each sensor electrode and one see-through preventing layer of the plurality of see-through preventing layers overlaps 0.2 mm or less.

2. The touch sensor according to claim 1, wherein the one see-through preventing layer expands to the vicinities of the interiors of the sensor electrodes.

3. The touch sensor according to claim 1, wherein the one see-through preventing layer is made of an electroconductive polymer.

4. The touch sensor according to claim 1, wherein the one see-through preventing layer and the sensor electrodes are made of the same material.

5. The touch sensor according to claim 1, wherein each adjacent pair of the sensor electrodes has a space therebetween, and the one see-through preventing layer lies in the space.

6. The touch sensor according to claim 5, wherein the one see-through preventing layer lies within the space, and the length of the one see-through preventing layer in the width direction of the space is more than 40% relative to the width of the space.

7. The touch sensor according to claim 1, wherein each sensor electrode and the one see-through preventing layer have a gap of 0.2 mm or less therebetween.

8. The touch sensor according to claim 1, wherein the one see-through preventing layer is disposed opposite the sensor electrodes with the transparent substrate therebetween.

9. The touch sensor according to claim 1, further comprising a resist layer covering the sensor electrodes, wherein the one see-through preventing layer is disposed on the surface of the resist layer.

* * * * *